United States Patent
Greywall

(12)
(10) Patent No.: US 6,369,374 B1
(45) Date of Patent: Apr. 9, 2002

(54) FILTER INCLUDING A MICRO-MECHANICAL RESONATOR

(75) Inventor: Dennis S. Greywall, Whitehouse Station, NJ (US)

(73) Assignees: Agere Systems Guardian Corp., Orlando, FL (US); Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/419,124

(22) Filed: Oct. 15, 1999

(51) Int. Cl.[7] ................................................ H02N 1/00
(52) U.S. Cl. .................... 250/201.1; 333/186; 333/219; 331/154
(58) Field of Search ....................... 250/201.1; 331/154; 333/186, 219, 227

(56) References Cited

U.S. PATENT DOCUMENTS 4,806,760 A * 2/1989 McGlade ..................... 250/330
5,165,289 A * 11/1992 Tilmans ..................... 73/862.59
5,914,553 A * 6/1999 Adams et al. ............... 310/309
6,238,946 B1 * 5/2001 Ziegler ......................... 438/50

* cited by examiner

Primary Examiner—Stephon B Allen
(74) Attorney, Agent, or Firm—Stroock & Stroock & Lavan LLP

(57) ABSTRACT

A filter constructed of a plurality of micro-mechanical resonators that are weakly coupled together. Micro-machining techniques enable the fabrication of a plurality of resonators having nearly identical frequency performance characteristics, with the difference in resonant frequency between and among the plurality of resonators being no more than approximately 1%. Any number of resonators may be coupled in virtually any configuration (e.g., circular, square, triangular, straight, etc.) to form a filter in accordance with the present invention. One of the resonators of the filter is driven into motion by an electrical signal, and the resonating movement (i.e., physical response) is detectable using optical interference techniques and systems directed at a resonator other than the resonator driven into motion.

13 Claims, 4 Drawing Sheets

FILTER INCLUDING A MICRO-MECHANICAL RESONATOR

FIELD OF THE INVENTION

The present invention relates to resonators and, more particularly, to a filter comprised of a plurality of weakly-coupled micro-mechanical resonators arranged in a predetermined configuration.

BACKGROUND OF THE INVENTION

Small physical structures, i.e., micro-mechanical devices, with resonant frequencies extending into the GHz spectrum may be fabricated on silicon using standard microelectronic fabrication techniques. Such devices operate surface-normal, thus permitting thousands to be fabricated on a semiconductor wafer. In addition, course lithography (i.e., 2 μm line-width) provides sufficient feature and structure definition and thereby minimizes the cost of such devices. However, excitation of such structures and devices and detection of motion thereof is difficult due to their size, which may be on the order of several microns. Typical electrostatic drive and detection schemes simply are not practical due to the small size of the structures and devices.

Band-pass filters may be constructed by physically coupling a plurality of micro-mechanical resonators together using a small strip of coupling material. However, it is difficult, if not impossible, to fabricate a plurality of identical or nearly identical resonators (and the coupling material strip). Consequently, a filter thus constructed may not perform optimally.

There thus exists a need in the art for a filter that overcomes the above-described shortcomings of the prior art.

SUMMARY OF THE INVENTION

The present invention is directed to a filter constructed of a plurality of micro-mechanical resonators that are weakly coupled together. Micro-machining techniques enable the fabrication of a plurality of resonators having nearly identical frequency performance characteristics, with the difference in resonant frequency between and among the plurality of resonators being no more than approximately 1%. Any number of resonators may be coupled in virtually any configuration (e.g., circular, square, triangular, straight, etc.) to form a filter in accordance with the present invention, with the shape factor of the filter improving with the number of coupled resonators. The micro-mechanical resonators of the filter of the present invention are preferably operated in a vacuum where an individual resonator may be characterized by a Q value as high as 100,000.

The present invention is directed to a filter for detecting a predetermined frequency in a source signal and comprises a band-pass filter having a plurality of micro-mechanical resonators that are weakly coupled to each other and each having deflectable part that is caused to resonate when a signal having the predetermined frequency is directed through a first one of the plurality of resonators. The inventive filter also includes an optical source for directing an incident optical signal at the deflectable part of a second one of the plurality of resonators that is different than the first resonator. The filter further includes an optical detector for detecting an optical signal reflected by the deflectable part of the second resonator and that is indicative of the presence of the desired frequency in the source signal.

Other objects and features of the present invention will become apparent from the following detailed description, considered in conjunction with the accompanying drawing figures. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

The present invention is directed to a band-pass filter constructed of a plurality of micro-mechanical resonators that are weakly coupled together. As used herein, the term weakly coupled refers to the fact that the resonators each has a cavity defined beneath a movable membrane, and that adjacently located resonators share a part of the membrane due to the absence of a part of the cavity wall beneath the shared membrane part. Micro-machining techniques enable the fabrication of a plurality of resonators having nearly identical frequency performance characteristics, with the difference in resonant frequency between and among the plurality of resonators being no more than approximately 1%. Any number of resonators may be coupled in virtually any configuration (e.g., circular, square, triangular, straight, etc.) to form a filter in accordance with the present invention, with the shape factor of the filter improving with the number of coupled resonators.

Figure 1:
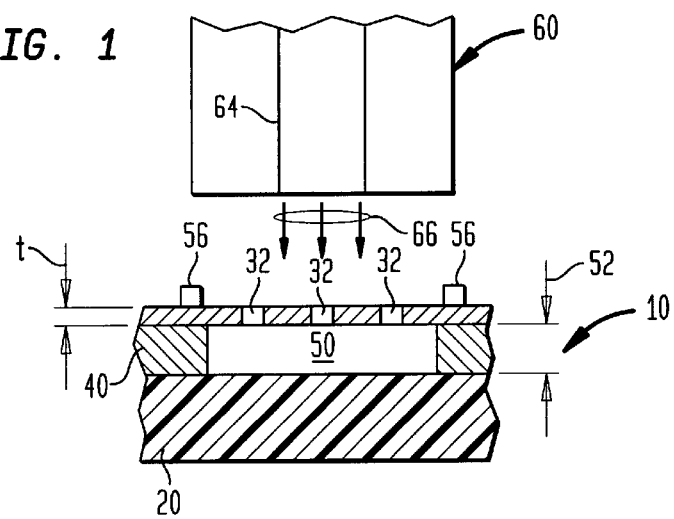
FIG. 1 depicts a partial cross-sectional view of a micro-mechanical resonator for use in a band-pass filter constructed in accordance with the present invention.
Figure 4:
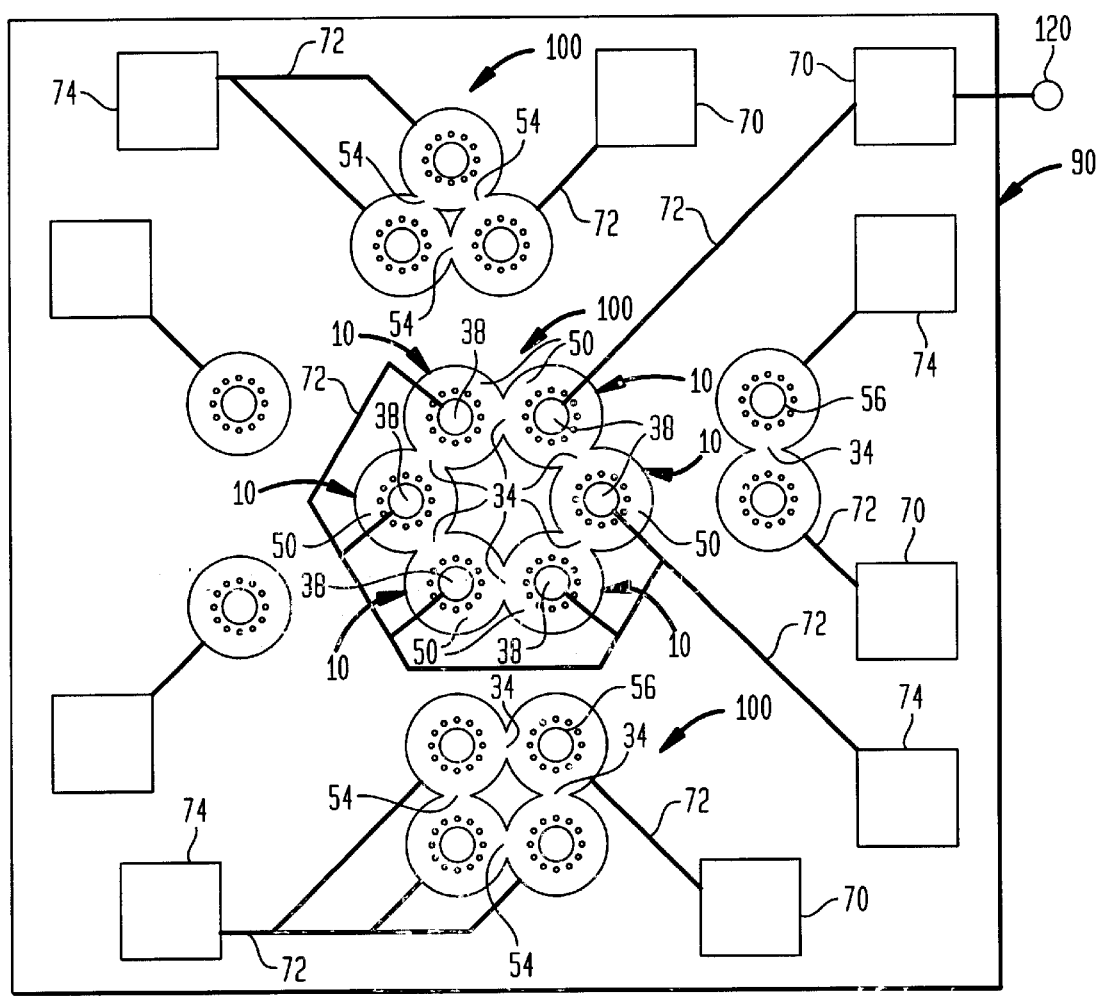
FIG. 4 depicts a top view of a semiconductor wafer having a plurality of band-pass filters constructed in accordance with various embodiments of the present invention.

Referring now to the drawings in detail, FIGS. 1 and 4 respectively depict a partial cross-sectional view of a micro-mechanical resonator 10 and a top view of a semiconductor wafer 90 having a plurality of filters 100 constructed in accordance with various embodiments of the present invention. Each of the filters 100 depicted in FIG. 4 contains at least two coupled resonators 10, one of which is electrically connected by a trace 72 to a source signal pad 70 through which an electrical signal may be directed through the connected resonator 10. To maintain identity of construction of the resonators 10 in a filter 100, the resonators 10 that are not connected to the source signal pad 70 are electrically connected together by a plurality of traces 72 and then, connected to a return signal pad 74. The plurality of traces 72 and return signal pad 74 add mass to the resonators not connected to the source signal pad 70 and ensure that each of the resonators 10 that make up the filter 100 are as nearly identical in all respects as possible.

Since each of the resonators 10 that make up a filter are nearly identical in construction and frequency response, the following description, which is directed to a single resonator 10, applies to all resonators 10 provided in a filter 100. A resonator 10 may be fabricated using art-recognized semiconductor fabrication techniques and methods. The resonator 10 comprises a movable membrane 30 disposed above a substrate 20 and spaced apart therefrom by an offset 40, defining a cavity 50 therebetween.

Motion of the membrane 30 is detected using graphical interference techniques to monochromatic light directed normal to the surface of the membrane 30. The membrane 30 is therefore preferably comprised of a single layer of material which is optically transparent at the operating wavelength of the optical source 60. If the substrate 20 is fabricated from silicon, then the preferred material for the membrane 30 is silicon nitride. Details of the optical interference measurements may be based on any one of a variety of operating principles. Consequently, the material from which the membrane 30 is fabricated and thus, the characteristics of the membrane 30, may vary depending on the desired operating principle. For example, if the resonator 10 includes a membrane 30 having a thickness approximately equal to $\lambda/4$, as defined by the following equation (1), then the refractive index $\eta$ of the membrane 30 should be approximately equal to the square root of the refractive index of the substrate 20. For a silicon substrate 20 and a silicon nitride membrane 30 having an index of refraction of approximately 1.87, the thickness t of the membrane 30 may be determined by the equation:

$$t = \frac{m\lambda}{4\eta} \quad (1)$$

where $\lambda$ is the wavelength of the light source, $\eta$ is the refractive index of the membrane material, and m is an odd whole number. Maximum sensitivity to changes in membrane position then occurs when the gap spacing between the membrane 30 and the substrate 20 has a thickness defined by equation (2).

$$t_{gap} \cong \frac{\left(n \pm \frac{1}{2}\right)\lambda}{4\eta_{vacuum}} \quad (2)$$

where $\eta_{vacuum}$ is approximately equal to 1, and n is an integer.

The filter 100 is excited electro-statically by applying a voltage between the conductive substrate 20 and an electrode-deposited on the insulating membrane. Suitable conductive materials for the electrode-include, by way of non-limiting example, aluminum, platinum, to tungsten, conducting silicon, indium tin oxide, gold, or alloys of those materials. In addition, silicides or appropriately doped amorphous silicon or polycrystalline silicon may be used for the conductive layer. If the conductive layer is optically opaque over the operating bandwidth of the modulator 20 (and of the filter 100), the conductive layer must not entirely eclipse the region of the membrane 30 that forms an optical window 38 (see, e.g., FIG. 4).

The offset 40 is a rapidly etchable material such as, for example, a phosphosilicate glass and, more specifically, silicon dioxide. The material used to fabricate the offset 40 should provide sufficient isolation between the membrane 30 and substrate 20, and should also facilitate formation of the cavity 50.

The substrate 20 may be fabricated of virtually any suitably conductive material that may be either optically transparent or absorbing over the operating optical bandwidth of the resonator 10. Suitable materials include, but are not limited to, silicon, gallium arsenide, indium phosphide, germanium, or indium tin oxide coated glass. If a semiconductor material is used for the substrate 20, that material should be appropriately doped. For example, if the substrate is silicon, it is preferably doped with any Group III or Group IV element, typically phosphorous or boron.

In a preferred embodiment, the membrane 30 and substrate 20 are at least partially conductive thereby creating a capacitor with the offset 40 and cavity 50 defining the dielectric, which may comprise air, a vacuum, etc. When an electrical signal is present at the source signal pad 70 (i.e., present at the membrane 30 of one resonator 10), the membrane 30 may be caused to deflect toward the substrate 20 due to a voltage potential created across the membrane 30 and substrate 20. The amount of deflection depends, at least in part, on the magnitude of the DC voltage component of the electrical signal.

The resonator 10 is constructed by depositing the various layers and materials in general blanket fashion using art-recognized semiconductor deposition and fabrication techniques and methods (e.g., silicon is deposited to form the substrate, silicon dioxide is deposited on the silicon to form the offset layer, and silicon nitride is then deposited on the silicon dioxide to form the membrane). The membrane 30 is preferably generally circular (see, e.g., FIG. 4), includes an optical window 38, and may be fabricated to a relatively high intrinsic stress level, thereby increasing the resonant frequency of the resonator 10. After the membrane 30 layer is deposited (in generally blanket fashion), a plurality of holes 32 are created in that layer in a generally circular pattern (see, e.g. FIGS. 1 and 4) that extend to a depth at least to the offset layer 40 therebeneath. In a preferred embodiment, twelve holes 32 having a diameter of approximately 5 microns (micrometers) are defined through the membrane layer to define a generally circular arrangement having a diameter of approximately sixty microns. That arrangement and dimensioning of holes 32 will produce a cavity 50 having a diameter of approximately 120 microns.

The semiconductor structure (comprised of the silicon, silicon dioxide and silicon nitride layers) is then subjected to a rapid, wet etch process during which an etching material passes through the holes 32 and removes some of the silicon dioxide material to form a generally circular (from a top view as depicted in FIG. 4) cavity 50 between the membrane 30 and substrate 20. The shape of the cavity 50 also serves to define a shape for the membranes 30 of each of the resonators 10. Precise control of the etching process is possible and provides for nearly identically sized and shaped cavities 50 for each of the resonators 10 in a filter 100. The controllability of the etching process also enables the formation of a path 54 between adjacently arranged resonators 10 by permitting the etching process to proceed just until the cavity wall between adjacently arranged resonators 10 is pierced. Removal of a part of the cavity wall couples a part 34 of the membranes 30 of adjacently located resonators 30.

Thus, adjacently located resonator 10 share a common part 34 of the membrane 30, which provides weak coupling between adjacently located resonators 10. Thus, when a signal present on the source signal pad 70 has a desired and predetermined frequency, the resonator 10 connected thereto will be caused to resonate. Since all of the resonators 10 in a filter 100 are nearly identical in construction and performance, all the resonators 10 are tuned to resonate at approximately the same frequency. The resonating movement of the resonator 10 connected to the pad 70 is mechanically coupled to each of the other resonators 10 via the membrane part 34 thus ensuring that all the resonators 10 in a filter 100 may be caused to resonate upon the presence of a signal having the desired and predetermined frequency.

Figure 6:
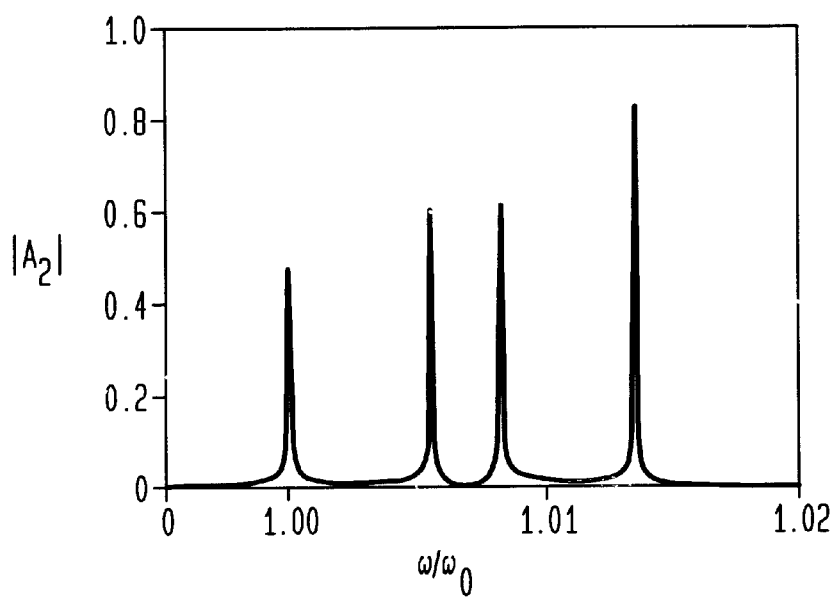
FIG. 6 is a graphical representation of the frequency response of a filter having four resonators in a nearly perfect vacuum and constructed in accordance with the present invention.
Figure 7:
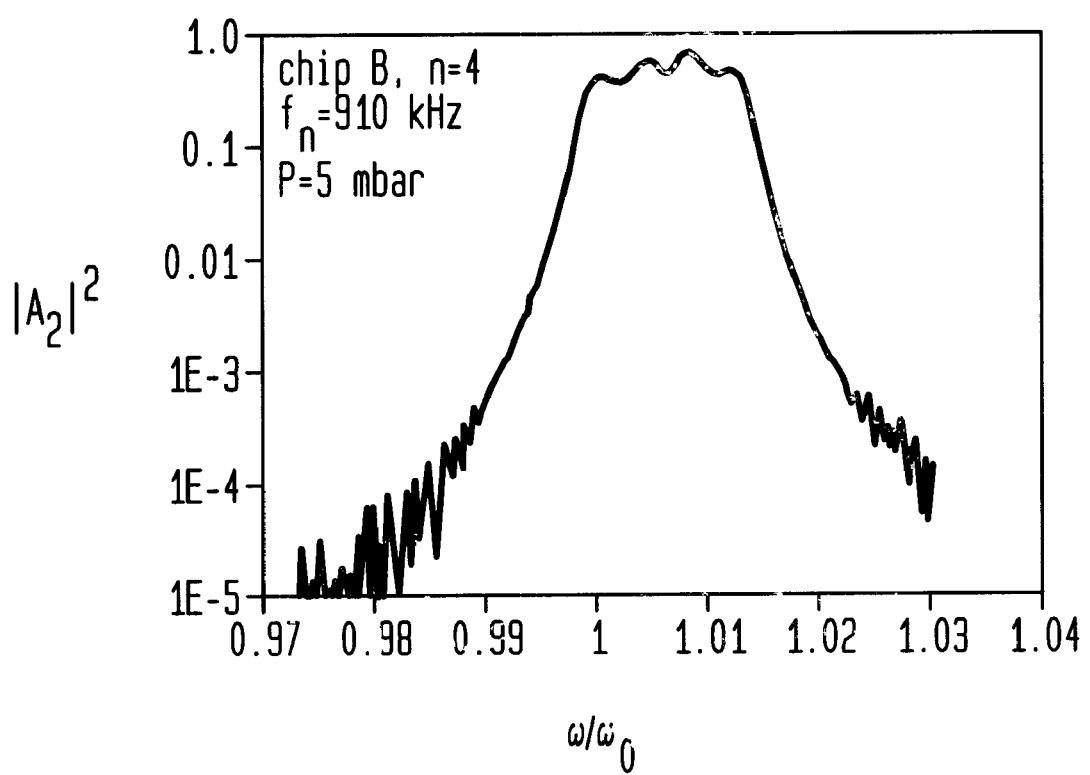
FIG. 7 is a graphical representation of the frequency response of a band-pass filter having four resonators in an atmosphere that is not a vacuum.

A filter 100 of n weakly coupled resonators 10 will generally have n vibrational modes that are closely spaced in frequency; less than approximately 1% difference between the frequencies. For example, in a filter 100 having four resonators 10, one vibrationa mode may cause all the membranes 30 to move up and down in phase with each other for the lowest resonant frequency. Another vibrational mode for a four-resonator filter 100 may be that every other resonator vibrates out of phase for the highest resonant frequency. The close spacing between the various modes of a four-resonator filter 100 are depicted graphically in FIG. 6. The vibrational modes of the filter 100 may be closely spaced to each other to the point where the discrete peaks depicted in FIG. 6 may overlap each other. This can be accomplished by decreasing the coupling strength (i.e., providing even weaker coupling), increasing the damping (by softening the vacuum as depicted in FIG. 7), or by increasing the number of resonators forming the filter 100. FIGS. 6 and 7 are graphical depictions of the resonance spectrum of four loosely coupled resonators; FIG. 6 is a nearly ideal vacuum and FIG. 7 is a softer vacuum (e.g., approximately 5 mbars ambient gas pressure surrounding resonator 10. By softening the vacuum, a band-pass filter is created by four loosely coupled resonators having a frequency pass spectrum as depicted in FIG. 7.

While a signal having the desired and predetermined frequency is electrically received by the filter 100 (via source signal pad 70), it is detected based on optical interference effects between a suspended, vertically movable membrane 30 and the substrate 20. The membrane 30 is preferably fabricated as a vertically movable, anti-reflection coating to the substrate 20. A small vertical motion of a membrane 30 (e.g., much less than $\lambda/4$) alters the thickness of the gap 52 (i.e., the gap spacing) and therefor the reflectivity of the resonator 10.

Figure 2:
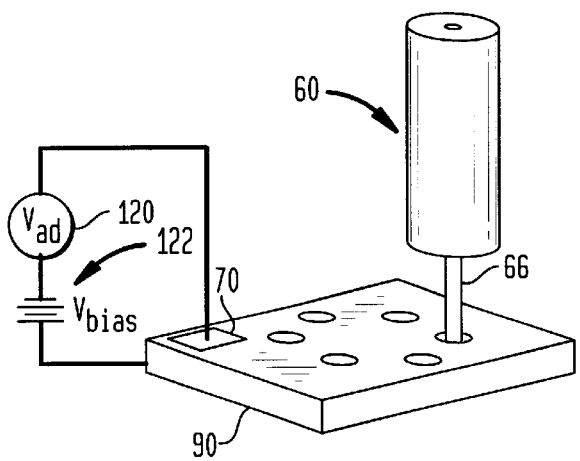
FIG. 2 is a perspective schematic view of a band-pass filter having an optical source and six micro-mechanical resonators weakly coupled together and constructed in accordance with the present invention.
Figure 5:
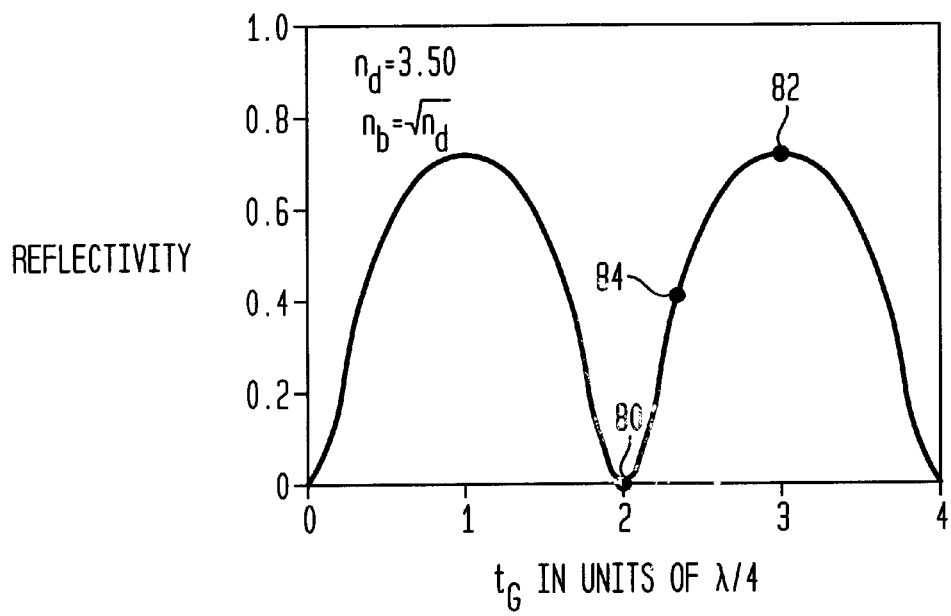
FIG. 5 is a graphical representation depicting the relationship between reflectivity of an optical signal and gap spacing in a resonator constructed in accordance with the present invention.

The membrane 30 may be caused to move generally toward the substrate 20 by the presence of a received or source signal 120 (see, e.g., FIG. 2) on the source signal pad 70 having a biasing component 122 (i.e., a DC voltage component). As the membrane 30 is caused to move from an unbiased position, depicted generally in FIG. 1, to a biased position, the thickness of the gap 52 changes and thus, the reflectivity of the resonator 10 to an incident optical signal 66 from an optical source 60 also changes (see, e.g., FIG. 1). When the membrane 30 is in an unbiased position, the reflectivity of the resonator 10 is located approximately between a minimum 80 and maximum 82 reflectivity level, as indicated by reference numeral 84 in FIG. 5. That position provides a maximum sensitivity of the resonator 10 to changes in the membrane position and thus to detection of the desired frequency.

Figure 3:
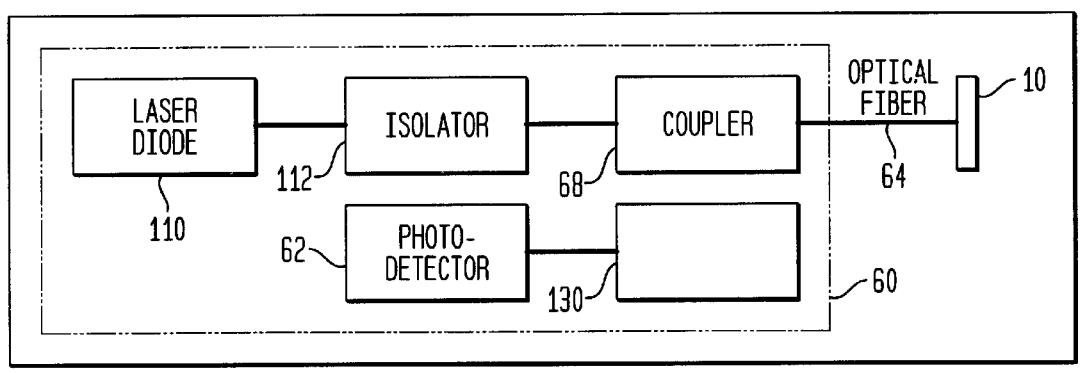
FIG. 3 is a schematic view of an optical source for use in a band-pass filter constructed in accordance with the present invention.

An optical source 60 (see, e.g., FIGS. 1–3) is provided in the filter 100 of the present invention to optically detect resonating movement of the membrane 30 of one of the resonators 10 in response to the presence of the desired or predetermined frequency in a source signal 120 on the source signal pad 70. A filter 100 constructed in accordance with the present invention may detect frequencies in the range of between approximately 10 kHz and 100 MHz. The optical source 60 includes a laser diode 110 for generating an incident optical signal 66 and is coupled to a fiber-optic cable 64 via an isolator 112 and a coupler 68. The laser 110 directs the optical signal 66 through the fiber-optic cable 64 toward the membrane 30 of one resonator 10 in the filter 100. Depending on the reflectivity of the resonator 10, as discussed in detail above, part of the optical signal 66 is reflected by the resonator 10 and may be coupled by the coupler 68 to a photodetector 62. The tautness of the membrane 30 and the level of coupling between and among the plurality of resonators 10 both contribute to the selectivity of the filter 100 at the desired frequency. The resonators 10 may only be caused to resonate when the desired frequency is present in the source signal 120. It is thus possible to detect resonating movement of the membrane 30 of one resonator 10 and thus detect reception by the filter 100 of a signal having the desired and predetermined frequency. The selection of the thickness of the membrane 30 and gap 52, as defined by equations (1) and (2) above, provide a structure having a controllable reflectivity of an optical signal, as described above. It is thus possible to provide a resonator 10 having a maximum sensitivity to detect resonating movement of the membrane 30.

The optical source 60 is preferably positioned above a resonator 10 that is located remote from the resonator 10 that receives the electrical signal 120, i.e., the resonator 10 that is electrically connected to the source signal pad 70. The optical detection of motion of the membrane 30 advantageously eliminates coupling of unwanted electrical signals between input and output leads of the filter 100. By placing the optical source 60 remote from the electrical signal 120, a high order band-pass filter 100 may be constructed. For example, and with reference to FIG. 4, a filter 100 comprised of six resonators 10 arranged in a generally circular configuration receives an input signal 120 via source signal pad 70 that is electrically connected to a first resonator 10, labeled "1". The optical source 60 is positioned above a fourth resonator 10, labeled "4", and located diametrically opposite of the first resonator 10. Alternatively, the resonators 10 that make up the filter 100, regardless of the number of resonators 10 provided, may be arranged in a generally linear, triangular, square, or various other geometric configurations, with the optical source 60 being located remote from the electrically connected resonator 10 in each instance.

The detector 62 is coupled to any art-recognized circuitry, device, or system 130 that may convert the reflected optical signal to an electrical signal indicative of the presence of the predetermined frequency in the source signal 120.

A filter 100 constructed in accordance with the various embodiments of the present invention may be used in a conventional radio configured to receive a radio-frequency (RF) signal comprised of a plurality of modulated RF carrier signals having different frequencies and located in an operating frequency band. In addition to the received RF signal, the radio also receives a plurality of undesired signals over a range of frequencies that are outside of the operating frequency band. The radio may be tuned or may be tunable to receive a desired or predetermined one of the frequencies contained in the RF signal, with the filter 100 of the present invention providing the frequency selectivity for the radio to enable reception of only the desired frequency to the exclusion of all other received frequencies. The use of a plurality of micro-machined resonators 10 to construct a band-pass filter 100 in accordance with the present invention provides a filter having a bandwidth that is orders of magnitude smaller than currently available with conventional filters. The quality factor of an individual resonator, which may be expressed as a ratio of the resonant frequency of the resonator ω to the resonator bandwidth $ω_0$, is a measure of the selectivity of the filter 100. For a filter 100 having four resonators 10 and constructed in accordance with the present invention, and where the cavity 50 generally defines a vacuum (i.e., η=1), the band-pass characteristics (square of the amplitude of response as a function of frequency) is graphically depicted in FIG. 6. If a vacuum is not maintained in the cavity 50, the Q of each resonator 10 in the filter 100 decreases and the band-pass of the filter 100 degrades.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A filter for detecting a predetermined frequency in a signal, said filter comprising:

a plurality of micro-mechanical resonators weakly coupled to each other and each having a deflectable part that is caused to resonate when an electrical signal comprising the predetermined frequency is directed through a first one of said plurality of resonators;

an optical source for directing an incident optical signal at said deflectable part of a second one of said plurality of resonators; and an optical detector for detecting an optical signal reflected by said deflectable part of said second one of said plurality of resonators, said reflected optical signal being indicative of the presence of the predetermined frequency in the electrical signal.

2. A filter as recited by claim 1, wherein said filter comprises a plurality of resonators that are weakly coupled to each other in a generally circular configuration, and wherein said first and said second resonators are diametrically opposed with respect to each other.

3. A filter as recited by claim 1, wherein said filter comprises a plurality of resonators that are weakly coupled to each other in a generally linear configuration, and wherein said first and said second resonators are located at opposite ends of the generally linear configuration.

4. A filter as recited by claim 2, wherein said filter comprises between approximately three and twelve resonators.

5. A filter as recited by claim 3, wherein said filter comprises between approximately two and twelve resonators.

6. A filter as recited by claim 1, wherein said plurality of micro-mechanical resonators are located adjacent to each other and wherein each said micro-mechanical resonator comprises:

a substrate;

a deflectable membrane located in spaced-apart relation with said substrate thereby defining a gap therebetween, said gap of each said resonator communicating with said gap of each resonator located adjacent thereto; and an offset located between said substrate and said membrane and for at least partially maintaining said spaced-apart relation between said substrate and said membrane;

wherein adjacently located resonators share a part of said deflectible membrane.

7. A filter as recited by claim 6, wherein said substrate is doped silicon.

8. A filter as recited by claim 6, wherein said membrane has a thickness determined by the equation $$t = \frac{m\lambda}{4\eta}$$

where λ is the wavelength of the optical signal, η is the refractive index of the membrane material, and m is an odd whole number.

9. A filter as recited by claim 8, wherein said membrane is silicon nitrate and wherein η is approximately equal to 1.87.

10. A filter as recited by claim 8, wherein said offset is constructed from a rapidly etchable material and wherein said gap has a thickness determined by the equation $$t_{gap} \cong \frac{\left(n \pm \frac{1}{2}\right)\lambda}{4\eta_{vacuum}}$$

where $\eta_{vacuum}$ is approximately equal to 1, and n is an integer.

11. A filter as recited by claim 10, wherein said rapidly etchable material is a phosphosilicate glass.

12. A filter as recited by claim 10, wherein said rapidly etchable material is silicon dioxide.

13. A filter as recited by claim 1, wherein said optical source includes a laser.

* * * * *